United States Patent [19]

Romano

[11] 3,828,265

[45] Aug. 6, 1974

[54] LOW FREQUENCY POWER AMPLIFIER

[75] Inventor: Aldo Romano, Milan, Italy

[73] Assignee: ATES Componenti Elettronici S.p.A., Milan, Italy

[22] Filed: Feb. 4, 1972

[21] Appl. No.: 223,614

[30] Foreign Application Priority Data

Feb. 5, 1971 Italy ................................ 20194/71

[52] U.S. Cl. ........................ 330/17, 330/24, 330/14, 330/38 M

[51] Int. Cl. ............................................ H03f 3/18

[58] Field of Search ................................ 330/14, 15

[56] References Cited

UNITED STATES PATENTS

| | | | |
|---|---|---|---|
| 3,419,809 | 12/1968 | Lach et al. | 330/15 X |
| 3,500,219 | 3/1970 | Rhodes | 330/14 |
| 3,500,220 | 3/1970 | Buckley | 330/14 X |
| 3,596,199 | 7/1971 | Hafler | 330/14 X |

*Primary Examiner*—Nathan Kaufman
*Attorney, Agent, or Firm*—Karl F. Ross; Herbert Dubno

[57] ABSTRACT

A power amplifier for low-frequency oscillations, realizable by integrated-circuit technique, comprises a number of cascaded transistors forming a high-impedance input stage, an intermediate or driver stage and a balanced power stage feeding a central output terminal 12. A control transistor $T_2$ constituting part of a composite input transistor $T_1$, $T_2$ has its collector grounded through a current-limiting transistor $T_4$ paired with an identical transistor $T_5$ producing an image current which duplicates the collector current of the control transistor $T_2$ and passes through a voltage divider composed of a pair of resistors $R_6$, $R_7$ each of the same magnitude as a feedback resistor $R_8$ inserted between the output terminal 12 and the emitter of transistor $T_2$. A controlled transistor $T_3$ at the entrance of the intermediate stage, of the same conductivity type (PNP) as the control transistor $T_2$ and substantially identical therewith, has its base connected to the collector of transistor $T_2$ and has its emitter energized through an ancillary transistor $T_9$ of opposite conductivity type whose base is tied to the junction of resistors $R_6$ and $R_7$. The emitters of transistors $T_9$ and $T_3$ are interconnected via a further resistor $R_9$ of the same magnitude; with the bases of twin transistors $T_4$ and $T_5$ jointly connected to a d-c supply terminal 1 through a biasing transistor $T_{10}$ and a low resistance (e.g. diodes D', D'') equaling the overall emitter/base resistance of composite transistor $T_1$, $T_2$, this arrangement stabilizes the means voltage of output terminal 12 at substantially half the voltage of the ungrounded supply terminal 4.

19 Claims, 2 Drawing Figures

LOW FREQUENCY POWER AMPLIFIER

SPECIFICATION

My present invention relates to a power amplifier for low-frequency oscillations.

An object of this invention is to provide an amplifier of this type which can be readily realized by integrated-circuit technique as a module adapted, when used in conjunction with a limited number of external circuit elements, to supply a variety of loads with maximum output power when energized from a given source of direct current.

A more specific object is to provide an amplifier of this description whose operating point (d-c output voltage in the absence of an a-c input signal) remains substantially equal to half the d-c supply voltage even if the latter is subject to fluctuations.

An amplifier according to my invention comprises, essentially, an input stage, an intermediate or driver stage and a balanced power stage constituted by cascaded transistors. One transistor of the input stage, hereinafter referred to as the control transistor, has a base connected to receive the a-c input signal (advantageously through an emitter-follower transistor energizing it in a Darlington configuration), a collector transmitting that signal to the intermediate stage and an emitter tied to a central output terminal of the power stage through a feedback resistor whose magnitude is large compared with the forward emitter/base resistance of this control transistor. The collector of the control transistor, whose base receives an a-c signal to be amplified, is connected to a preferably grounded supply terminal through a current-limiting transistor and is also tied to the base of a substantially identical controlled transistor of the same conductivity type (e.g. PNP) whereby the base currents of the control and controlled transistors substantially balance each other. In this manner, the emitter current of the control transistor (drawn through the feedback resistor) varies symmetrically about an average value so as to hold the mean voltage of the output terminal substantially at a median value between the potentials of the supply terminals, i.e., at about half the voltage of the ungrounded supply terminal if one of these terminals is grounded.

In accordance with another feature of my invention, the current-limiting transistor in series with the control transistor is one of a pair of identical twin transistors whose mate draws an image current, duplicating the collector current of the control transistor, through a voltage divider biasing an ancillary transistor inserted in the emitter lead of the controlled transistor. More particularly, this voltage divider consists essentially of two series resistors each having the same magnitude as the feedback resistor, the junction of these series resistors being tied to the base of the ancillary transistor which is of a conductivity type (e.g. NPN) opposite that of the controlled transistor and has its emitter connected to that of the latter transistor through a fourth resistor of the same magnitude. The bases of the twin transistors are advantageously connected to the ungrounded supply terminal through a biasing transistor whose base is connected directly to the collector of the twin transistor generating the image current, the biasing transistor lying in series with a relatively low resistance which may be constituted by the forward resistance of one or more diodes and which substantially equals the forward emitter/base resistance of the control transistor. If, according to a preferred embodiment, the control transistor forms part of a composite transistor connected in a Darlington configuration, this low resistance should have a value equaling the overall emitter/base resistance of the composite transistor which generally is twice the individual emitter/base resistance of the control transistor itself.

Pursuant to still another feature of my invention, the power stage of the amplifier includes two pilot transistors of opposite conductivity types having their bases connected to the collector of the last transistor of the driver stage, these two pilot transistors working into respective final transistors of identical conductivity type (e.g. NPN) whose emitter-collector circuits extend between the central output terminal and respective terminals of the d-c source. One of these pilot transistors, i.e. the one energizing the final transistor whose emitter is joined to the central output terminal, may also be connected to that final transistor in a Darlington configuration so as to have an emitter-follower effect preventing its saturation over a wide swing range of one polarity of the a-c input signal; a similar dynamic for the other signal polarity may be realized by inserting an additional transistor in series with the other pilot transistor in a feedback path from the central output terminal, the additional transistor and the associated pilot transistor being of opposite conductivity types and having their emitters directly interconnected.

The above and other features of my invention will be described in greater detail hereinafter with reference to the accompanying drawing in which.

Figure 1:
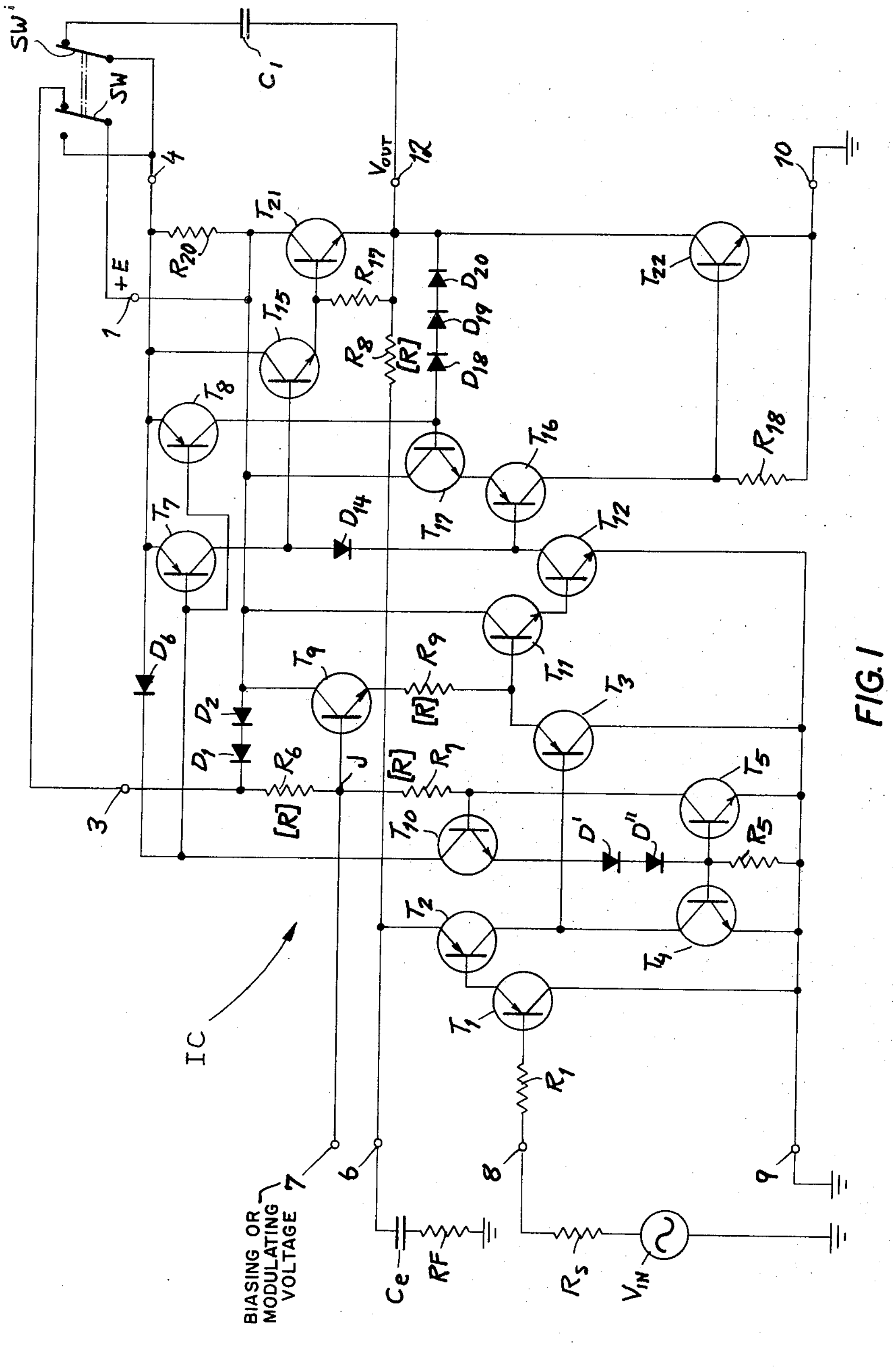
FIG. 1 is a circuit diagram of an amplifier according to the invention.

The amplifier shown in FIG. 1 is essentially an integrated circuit IC with a number of terminals 1, 3, 4, 6–10 and 12. A switch SW, in its illustrated position, interconnects terminals 1 and 3 so as to short out a pair of diodes $D_1$ and $D_2$ inserted between these terminals. A second switch SW', ganged with switch SW, connects a condenser $C_1$ across terminals 4 and 12 in the illustrated position; upon reversal of switch SW, terminal 1 is connected to terminal 4 (rather than to terminal 3) so as to short-circuit a resistor $R_{20}$. Terminal 1 carries positive supply voltage +E from a direct-current source whose grounded negative pole is connected to terminals 9 and 10. The amplifier output is developed across terminals 10 and 12, the latter having a voltage $V_{out}$ which in the quiescent state is half the supply voltage +E as will be shown later on. An alternating input voltage $V_{in}$ is delivered to terminal 8 through a resistance $R_s$ representing the internal impedance of the signal source. Terminal 6 is grounded for high frequencies through an external capacitor $C_e$ in series with a resistor RF serving as a negative-feedback impedance for the input stage of the amplifier.

The input stage of the amplifier comprises a pair of PNP transistors $T_1$, $T_2$ connected in a Darlington circuit, the base of transistor $T_1$ being joined to input terminal 8 through a resistor $R_1$. Transistor $T_2$, which is the control transistor referred to above, has its emitter connected by way of a feedback resistor $R_8$ to output terminal 12, resistor $R_8$ lying in the only direct-current path between this emitter and the supply terminal 1.

Two serially connected resistors $R_6$ and $R_7$, of the same magnitude R as resistor $R_8$, are joined directly to terminal 3 and through the forward resistances of the cascaded diodes $D_1$, $D_2$ to terminal 1.

A pair of twin NPN transistors $T_4$ and $T_5$, with grounded emitters and interconnected bases, form respective branches of a current generator also including a biasing transistor $T_{10}$ whose collector is energized from high-voltage terminal 4 through a diode $D_6$. The emitter of transistor $T_{10}$ is connected by way of two cascaded diodes D', D'' to the bases of transistors $T_4$, $T_5$ and to the grounded input terminal 9 via a resistor $R_5$ maintaining the twin transistors in a state of predetermined conductivity. The base of transistor $T_{10}$ is tied to the collector of transistor $T_5$ and to resistor $R_7$. Transistor $T_4$, whose collector is tied to that of transistor $T_2$, establishes a constant collector current for the latter transistor which is always conductive but prevented from saturation by virtue of its emitter-follower connection to feedback resistor $R_8$. Transistor $T_5$ draws an identical image current through the voltage divider constituted by resistors $R_6$ and $R_7$.

It will be noted that the input signal $V_{in}$ is applied to transistor $T_1$ without the intermediary of any coupling capacitor, thereby not only eliminating an external component but also suppressing low-frequency distortion and signal delays upon cut-in. Also, the high input impedance of the Darlington circuit $T_1$, $T_2$ can be fully utilized by connecting the signal source $V_{in}$ across terminals 8 and 9 without the interposition of an external voltage divider. The negative feedback afforded by resistors RF and $R_8$ further increases the dynamic input resistance.

The collector of control transistor $T_2$ is tied to the base of a controlled transistor $T_3$ of PNP type which is the entrance transistor of an intermediate stage also including a Darlington-type compound NPN transistor $T_{11}$, $T_{12}$ in cascade therewith. The emitter of transistor $T_3$, whose collector (like that of transistor $T_1$) is grounded, is connected through a resistor $R_9$ of magnitude R to the emitter of an ancillary NPN transistor $T_9$ having its base connected to the junction J of resistors $R_6$, $R_7$ and having its collector energized directly from supply terminal 1. This supply terminal is also connected directly to the collector of the transistor $T_{11}$. Transistor $T_{12}$, which is the last transistor of the intermediate stage, drives two pilot transistors $T_{15}$ (PNP) and $T_{16}$ (PNP) of the output stage of the amplifier working into respective power transistors $T_{21}$, $T_{22}$, both of NPN type. Transistor $T_{21}$ has its collector joined to supply terminal 1 and its emitter tied to output terminal 12 as well as to the collector of transistor $T_{22}$ whose emitter is grounded. Biasing resistors $R_{17}$ and $R_{18}$ are connected in the base/emitter circuits of transistors $T_{21}$ and $T_{22}$, respectively.

Two further current-limiting PNP transistors $T_7$ and $T_8$ have their emitters connected in parallel to ancillary supply terminal 4 and have their bases energized from that terminal through the forward resistance of diode $D_6$. Transistor $T_7$ feeds the transistor $T_{12}$ through a diode $D_{14}$ whose forward resistance provides a voltage differential between the bases of pilot transistors $T_{15}$ and $T_{16}$. Transistor $T_8$ supplies operating current to transistors $T_2$ and $T_{22}$ and also applies a biasing potential to the base of an additional transistor $T_{17}$ of NPN type whose emitter is tied to that of the PNP pilot transistor $T_{16}$. Transistor $T_{17}$, whose collector is energized directly from supply terminal 1, has its base/emitter circuit included in a feedback loop which extends from the collector of transistor $T_{22}$ (and therefore from output terminal 12) through three cascaded diodes $D_{18}$, $D_{19}$, $D_{20}$ by way of transistors $T_{17}$ and $T_{16}$ to the base of transistor $T_{22}$.

In operation, an input signal $V_{in}$ impressed upon terminal 8 is transmitted via cascaded transistors $T_1$, $T_2$, $T_3$, $T_{11}$ and $T_{12}$ to pilot transistors $T_{15}$, $T_{16}$ in parallel, these two pilot transistors modulating the conductances of final transistors $T_{21}$ and $T_{22}$ in a balanced manner so that the output voltage on terminal 12 varies in the same sense as the input voltage. A negative signal on terminal 8, for example, drives the base of transistor $T_{21}$ negative and the base of transistor $T_{22}$ positive so as to lower the voltage $V_{out}$ on terminal 12; this latter voltage is degeneratively fed back through resistor $R_8$ to the emitter of control transistor $T_2$, thereby further increasing the input resistance of the composite transistor $T_1$, $T_2$. The increased current flow through transistor $T_{22}$ also drives the base of transistor $T_{17}$ more negative so as to reduce the positive emitter potential of transistor $T_{16}$ which thereby tends to follow the lowering of its base potential in response to the input signal. A similar emitter-follower effect is also experienced by transistor $T_{15}$ whose emitter potential is lowered by the feedback through biasing resistor $R_{17}$. This prevents the saturation of transistors $T_{15}$ and $T_{16}$ during positive and negative half-cycles, respectively.

Figure 2:
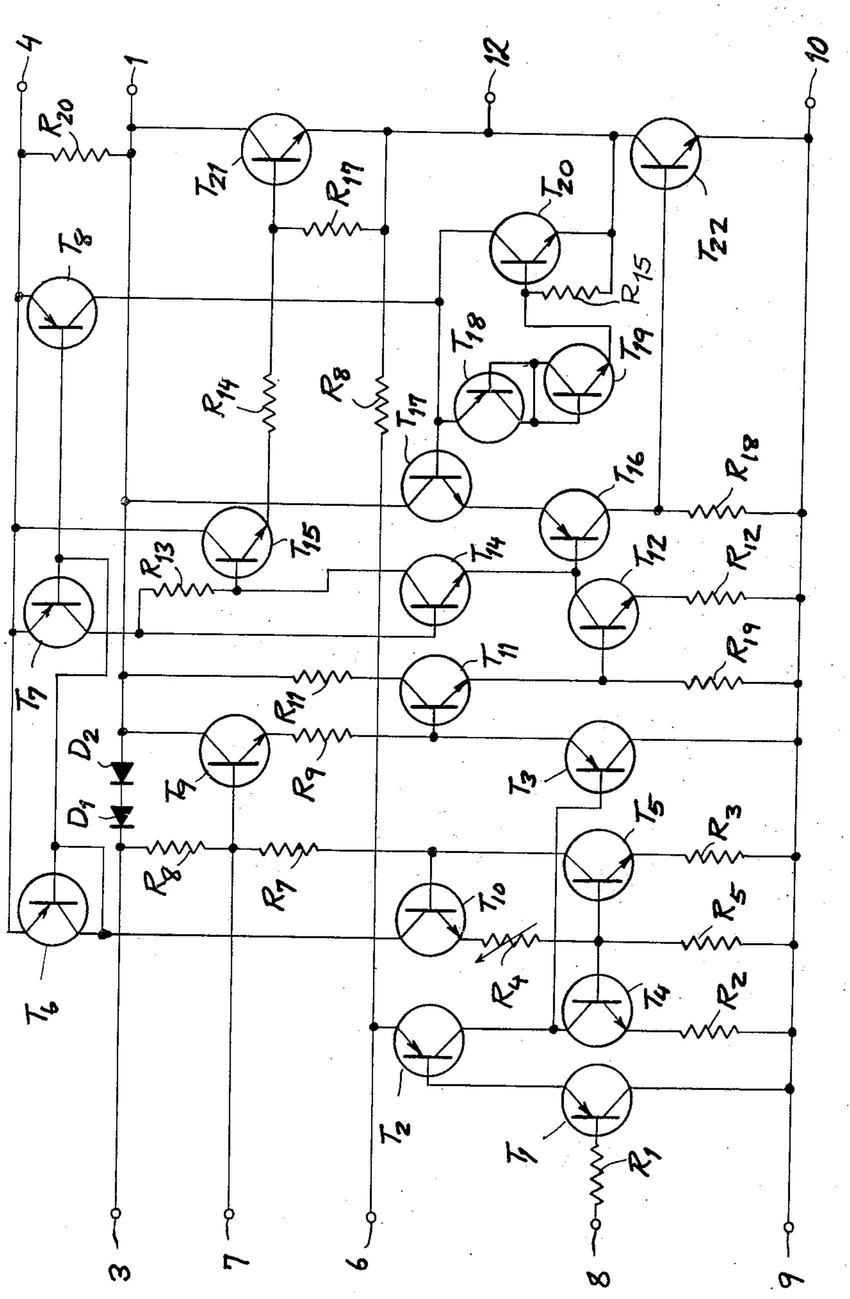
FIG. 2 is a similar circuit diagram showing a modification.

As illustrated in FIG. 2, the biasing diodes D' and D'' can be replaced by an adjustable resistor $R_4$ in series with fixed resistor $R_5$ to facilitate manual variation of the matching currents traversing transistors $T_4$ and $T_5$. FIG. 2 also shows that diodes $D_6$, $D_{14}$ and $D_{18}$ – $D_{20}$ can be replaced by the forward base-emitter resistances of respective transistors $T_6$, $T_{14}$, $T_{18}$, $T_{19}$ and $T_{20}$; transistors $T_6$, $T_{18}$ and $T_{19}$ have their collectors directly joined to their bases whereas transistors $T_{14}$ and $T_{20}$ have biasing resistors $R_{13}$ and $R_{15}$ inserted in their collector/base and base/emitter circuits, respectively. Transistors $T_6$ and $T_{18}$ are of PNP type, transistors $T_{14}$, $T_{19}$ and $T_{20}$ being of NPN type.

In the following more detailed analysis of the mode of operation of my improved amplifier I shall use the following symbols;

- $V_{bek}$ — the forward base/emitter resistance of any transistor $T_k$ ($k$ being a generic subscript); thus, $V_{be5}$ is the base/emitter resistance of transistor $T_5$.
- $V_{cek}$ — the collector/emitter voltage of a transistor $T_k$ (with the postscript sat indicating a state of saturation);
- $I_{ck}$ — the collector current of any transistor $T_k$;
- $I_{ek}$ — the emitter current of such transistor;
- $I_{bk}$ — the corresponding base current;
- $V_d$ — the voltage drop across any forwardly biased diode.

Let us now consider the collector current $I_{c5}$ of transistor $T_5$ under the simplifying assumption that all transistors have a current gain of infinity, i.e., that their base current is zero. We can then write $$I_{c5} = E - V_{be5} - 2V_5 - V_{be10} \qquad (1)$$

and, in view of the identical bias of transistors $T_4$ and $T_5$, $$I_{e2} = I_{c2} = I_{c4} = I_{c5} \quad (2)$$

In the quiescent state, in which the input voltage of terminal 8 is zero, we can also write $$V_{out} = V_O = V_{be1} + V_{be2} + RI_{e2} \quad (3)$$

From equations (1), (2) and (3) it follows that $$V_O = V_{be1} + V_{be2} + E - V_{be5} - 2V_d - V_{be10}/2 \quad (4)$$

If $V_{bek} = V_d$, equation (4) simplifies to $$V_O = E/2 \quad (5)$$

Looking back at equation (1) we find that the collector current $I_{c5}$ of matching transistor $T_5$ has two components, the first of these components having a value $E/2R$ depending only upon the supply voltage; the voltage drop across resistor $R_8$ due to the second component compensates the emitter potential of transistor $T_2$. These components also appear in current $I_{c21}$.

Equation (5) is valid only for the assumed case of very high current gain. In many practical instances, however, the base current of transistor $T_2$ cannot be neglected, particularly in the case of transistors of the epitaxial type having a relatively low current-amplification factor. In that case, with $I_{e2} = I_{c2} + I_{b2}$, equation (5) is modified to read $$V_O = E/2 + RI_{b2} \quad (5')$$

The error due to the term $RI_{b2}$, however, can be compensated by the base current of transistor $T_3$ which has essentially the same structure as transistor $T_2$. With $$I_{e2} = I_{c2} + I_{b2} = I_{c4} - I_{b3} + I_{b2} = I_{c5} - I_{b3} + I_{b2} \quad (6)$$

we find that $$V_O = E/2 + R(I_{b2} - I_{b3}) \quad (7)$$

which for $I_{b2} \approx I_{b3}$ reduces to equation (5). Since $R_6 = R_9 = R$, the emitter current of transistor $T_3$ is given by $$I_{e3} = E - V_{be9} - V_{be11} - V_{be12}/R - I_{c5} \quad (8)$$

wherein the first right-hand term differs from the value of $2I_{c5}$, as per equation (1), only by the negligible amount $V_{bek}/R$ wherein $V_{be}$ is of substantially the same magnitude as $V_d$. It follows that $I_{e3} \approx I_{c5}$, i.e. the emitter current drawn by the first transistor $T_3$ of the intermediate stage substantially equals the image current passing through transistor $T_5$. The finite current gain of transistors $T_9$ and $T_{10}$ can be compensated by the adjustment of resistor $R_4$ (FIG. 2) replacing diodes D′ and D″.

In the alternate position of switches SW and SW′, with the connection between terminals 1 and 3 interrupted, diodes $D_1$ and $D_2$ introduce a voltage drop equal to $2V_d$. With resistor $R_{20}$ short-circuited, the upper limit of the voltage swing on output terminal 12 has the value $E - V_{be21} - V_{be15} - V_{ce9}(\text{sat})$ whereas the lower limit is the voltage $V_{ce22}(\text{sat})$. The mean $V_m$ of these values is given by $$V_m = E - V_{be21} - V_{be15} - V_{ce7}(\text{sat}) + V_{ce22}(\text{sat})/2 \quad (9)$$

which, if the saturation voltages of transistors $T_1$ and $T_{20}$ are substantially equal, reduces to $$V_m = E - V_{be21} - V_{be15}/2 \quad (10)$$

The reduction of the image current $I_{c5}$ by the value $2V_d/2R$, due to the presence of diodes $D_1$ and $D_2$, makes the quiescent output voltage $V_O$ substantially equal to the voltage $V_m$ as per equation (10).

Terminal 7 may be used to place a biasing or modulating voltage upon the bases of transistors $T_9$ and $T_{10}$.

The function transistor $T_7$ is somewhat analogous to that of transistor $T_4$ in limiting the collector current of transistor $T_{12}$ to an approximately constant magnitude, with the base currents of transistors $T_{15}$ and $T_{16}$ substantially balancing each other. Transistor $T_8$ supplies the necessary base current to transistor $T_{17}$; its contribution to the currents drawn by transistors $T_2$ and $T_{22}$ is minimized by the lowering of the potential of ancillary supply terminal 4 in the illustrated switch position through the voltage drop introduced by resistor $R_{20}$. Shunt capacitor $C_1$ holds the voltage of terminal 4 substantially constant in the face of varying current flow through dropping resistor $R_{20}$; in the alternate position of switches SW and SW′, in which terminals 1 and 4 are at the same potential, this capacitor is not needed.

I claim:

1. A power amplifier comprising an input stage including a control transistor, an intermediate stage including a controlled transistor of the same conductivity type as said control transistor, and a power stage including a pair of final transistors serially connected in balanced relationship between a central output terminal and respective supply terminals of a source of direct current, each of said transistors being provided with an emitter, a base and a collector, said output terminal being connected to the emitter of one and to the collector of the other of said final transistors, the collector of said controlled transistor being connected to one of said supply terminals;

coupling means in said power stage for connecting the bases of said final transistors in push-pull to said intermediate stage;

a resistive direct-current feedback connection extending from said output terminal to the emitter of said control transistor, the base of said control transistor being connected to receive an a-c signal to be amplified, the collector of said control transistor being connected to the base of said controlled transistor;

a current-limiting transistor connected in series with said control transistor between the collector of the latter and said one of said supply terminals for maintaining an emitter current in said control transistor holding the mean voltage of said output terminal substantially at a median value between the potentials of said supply terminals, the emitter of said control transistor being conductively joined to the other of said supply terminals by way of said feedback connection;

an ancillary transistor connected in series with said controlled transistor between the emitter thereof and said other of said supply terminals;

a matching transistor duplicating said current-limiting transistor and generating an image current equal to the collector current of said control transistor, said current-limiting transistor and said matching transistor having interconnected bases and having their emitters connected to said one of said supply terminals; and biasing means for said ancillary transistor connecting the base thereof to the collector of said matching transistor.

2. A power amplifier as defined in claim 1 further comprising a voltage divider extending between the collector of said matching transistor and said other supply terminal, the base of said ancillary transistor being tied to a junction of said voltage divider.

3. A power amplifier as defined in claim 2 wherein said voltage divider comprises two identical resistors forming said junction, the resistance of each of said resistors equaling that of said resistive feedback connection.

4. A power amplifier as defined in claim 3 wherein said ancillary transistor is of a conductivity type opposite that of said controlled transistor and has its emitter connected to the emitter of said controlled transistor through a further resistor of the same magnitude as said identical resistors.

5. A power amplifier as defined in claim 4 wherein said current-limiting and matching transistors are provided with a common biasing transistor having an emitter connected to their bases, a collector connected to said other supply terminal and a base tied to the collector of said matching transistor.

6. A power amplifier as defined in claim 5, further comprising resistance means between said interconnected bases and the emitter of said biasing transistor, said resistance means having a magnitude which is small compared with that of the resistance of said feedback connection.

7. A power amplifier as defined in claim 6 wherein said control transistor is part of a composite transistor connected in a Darlington configuration with an overall forward emitter/base resistance substantially equal to the magnitude of said resistance means.

8. A power amplifier as defined in claim 5, further comprising a voltage-dropping resistor inserted between said other supply terminal and the collector of said biasing transistor, the bases of said final transistors being provided with biasing circuits extending through said voltage-dropping resistor to said other supply terminal.

9. A power amplifier as defined in claim 8, further comprising a capacitive shunt between the collector of said biasing transistor and said output terminal.

10. A power amplifier as defined in claim 8, further comprising diode means inserted between said voltage divider and said other of said supply terminals with a forward resistance of substantially the magnitude of said resistance means.

11. A power amplifier as defined in claim 1 wherein said intermediate and power stages are connected to provide negative feedback through said resistive connection to the emitter of said control transistor.

12. A power amplifier as defined in claim 1 wherein said coupling means comprises a first pilot transistor of one conductivity type in cascade with said one of said final transistors, and a second pilot transistor of the opposite conductivity type in cascade with said other of said final transistors, said pilot transistors having bases connected to an output lead of said intermediate stage, said final transistors being both of said one conductivity type.

13. A power amplifier as defined in claim 12, further comprising a biasing diode connected between the bases of said pilot transistors.

14. A power amplifier as defined in claim 12 wherein said power stage further includes an additional transistor in series with said second pilot transistor having a base/emitter circuit connected between said output terminal and the emitter of said second pilot transistor for preventing saturation of the latter.

15. A power amplifier as defined in claim 14 wherein said first pilot transistor and said one of said final transistors are connected in an emitter-follower circuit.

16. A power amplifier as defined in claim 14 wherein said additional transistor is of the same conductivity type as said first pilot transistor and has an emitter connected to the emitter of said second pilot transistor.

17. A power amplifier as defined in claim 12 wherein said output lead is connected to a collector of a transistor in said intermediate stage, further comprising another current-limiting transistor connected between the last-mentioned collector and said other supply terminal.

18. A power amplifier as defined in claim 1 wherein said intermediate stage includes a composite transistor of Darlington configuration following said controlled transistor.

19. A power amplifier as defined in claim 1 wherein said input, intermediate and power stages form part of an integrated module.

* * * * *